United States Patent [19]

Kersten et al.

[11] Patent Number: 4,668,914

[45] Date of Patent: May 26, 1987

[54] CIRCULAR, AMORPHOUS METAL, HALL EFFECT MAGNETIC FIELD SENSOR WITH CIRCUMFERENTIALLY SPACED ELECTRODES

[75] Inventors: Peter Kersten, Leonberg; Hans Volz, Schwieberdingen; Ulrich Seyfried, Stuttgart, all of Fed. Rep. of Germany

[73] Assignee: International Standard Electric Corporation, New York, N.Y.

[21] Appl. No.: 679,664

[22] Filed: Dec. 7, 1984

[30] Foreign Application Priority Data

Dec. 23, 1983 [DE] Fed. Rep. of Germany ....... 3346646

[51] Int. Cl.$^4$ ................ G01R 33/06; G01B 7/30; H01L 43/06
[52] U.S. Cl. .................................. 324/251; 324/208; 338/32 H
[58] Field of Search ............... 324/207, 208, 244, 251, 324/252, 117 H; 307/309; 338/32 R, 32 H; 310/DIG. 3; 357/27

[56] References Cited

U.S. PATENT DOCUMENTS

| | | | |
|---|---|---|---|
| 3,162,805 | 12/1964 | Robertson | 324/208 X |
| 4,476,454 | 10/1984 | Aboaf et al. | 324/252 X |
| 4,517,515 | 5/1985 | Reinitz et al. | 324/252 |
| 4,528,481 | 7/1985 | Becker et al. | 324/244 X |

FOREIGN PATENT DOCUMENTS 0805215 2/1981 U.S.S.R. ............................. 324/251

OTHER PUBLICATIONS

Carver, G. P., "A Corbino Disk . . . in Amorphous Semiconductors", The Review of Scientific Instruments, vol. 43, No. 9, Sep. 1972, pp. 1257-1263.

Grubbs, W. J., "The Semiconductor Hall—Effect Circulator", Electronics, Oct. 10, 1958, pp. 118, 120, 122.

Primary Examiner—Gerard R. Strecker
Attorney, Agent, or Firm—T. L. Peterson

[57] ABSTRACT

A magnetic field sensor is disclosed with which the direction of a magnetic field can be determined by using the planar Hall effect. An active layer of the sensor is made of a ferromagnetic amorphous metal which is magnetically isotropic. Thus, the magnetization in the active layer always has the direction of an external magnetic field. The developed planar Hall voltage is a measure of the direction of the magnetic field.

6 Claims, 5 Drawing Figures

CIRCULAR, AMORPHOUS METAL, HALL EFFECT MAGNETIC FIELD SENSOR WITH CIRCUMFERENTIALLY SPACED ELECTRODES

BACKGROUND OF THE INVENTION

The present invention relates to a magnetic field sensor, and more particularly to a position sensor for a rotatable shaft or the like.

PRIOR ART STATEMENT

For a long time the Hall effect has been used to measure magnetic fields. When an electric current flows through a conductor, and a magnetic field simultaneously passes through this conductor in a direction perpendicular to the electric current, a field is produced perpendicular to these two directions whose strength can be taken across the surface of the conductor as a voltage. Less known is the fact that a field is also produced in a direction perpendicular to the direction of current flow, in a plane determined by the magnetic field and the direction of current flow. This effect is referred to as the "planar Hall effect".

A magnetic field sensor which makes use of the planar Hall effect consists, for example, of a circular sheet-metal disk showing a magnetic anisotropy whose preferred direction lies in the disk. The same has four terminals evenly spaced along its circumference. They form two intersecting current paths one of which runs parallel to the preferred direction of the magnetic anisotropy. Such magnetic field sensors are commonly constructed using thin film techniques. See, for example, V. D. Ky, "Planar Hall Effect in Ferromagnetic Films", Phys. Stat. Sol., Vol. 26, page 565 (1968).

Prior art magnetic field sensors do not operate well in such a way that the direction of a magnetic field can be determined with it.

SUMMARY OF THE INVENTION

In accordance with the present invention, there is provided a magnetic field sensor predicated on the following discovery: When a magnetic field H is applied across a magnetically anistropic magnetic field sensor in a direction perpendicular to the preferred direction of the magnetic anisotropy, a magnetization results whose direction makes a predetermined angle with that preferred direction. The predetermined angle is dependent on the quotient of the intensity of the external magnetic field, H, and the intensity of the anisotropy field, $H_k$. The Hall voltage obtainable from the sensor electrodes as a result of the planar Hall effect is dependent upon the strength H of the applied magnetic field exclusively via the said predetermined angle.

The voltage developed is thus a direct measure of the direction of the magnetization in the sensor. If the direction of the magnetization can be made equal to the direction of the external magnetic field H, it is possible to determine the direction of a magnetic field. This can be done with a magnetic field sensor constructed in accordance with the present invention.

DESCRIPTION OF THE PREFERRED EMBODIMENT

Figure 1:
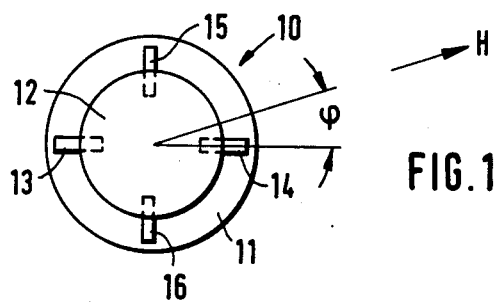
FIG. 1 is a top plan view of a magnetic field sensor constructed in accordance with the present invention.
Figure 2:
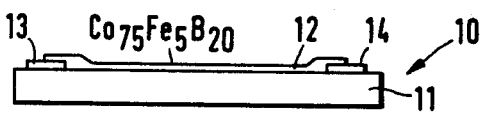
FIG. 2 is a diagrammatic cross-sectional view of the sensor of FIG. 1.

An embodiment of the magnetic field sensor 10 of the present invention will now be described in more detail with the aid of FIGS. 1 and 2. Four pad electrodes 13-16 are deposited on the upper side of a circular disk shaped substrate 11. The pad electrodes 13-16 are arranged radially in the outer region of substrate 11 spaced at 90° intervals. They are made of gold with a chromium bonding layer. A circular active layer 12 is deposited concentrically on the substrate 11 and covers parts of the electrodes 13-16. It is made of $Co_{75}Fe_5B_{20}$ and deposited by sputtering in the form of a layer 100 to 500 nanometers thick. Its diameter is approximately 5 to 20 mm. The layer may also be deposited by evaporation. It is magnetically isotropic. The isotropy can be achieved by annealing in a rotating magnetic field (4 h at 260° C., 400 A/m).

Two opposite electrodes 13 and 14 of the magnetic field sensor 10 may be connected to a current source. When this current carrying sensor 10 is placed in an external magnetic field H, a parallel magnetization is obtained in the active layer 12. The magnetic field H and the magnetization can then make an angle $\phi$ with the direction of current flow. Between the two electrodes 15 and 16, which are not traversed by current, the Hall voltage $$U_H \sim \sin 2\phi$$

is developed.

Instead of a quartz substrate 11, a glass, semiconductor or ceramic substrate could be used. The electrodes 13-16 could also be made of any other suitable material.

The active layer 12 can also be made of other ferromagnetic amorphous metals. An alloy of $Co_xFe_yB_{100-x-y}$, where $70 \leq x \leq 80$ and $4 \leq y \leq 10$ (x, y in atom %), proved especially suitable for this purpose. Experiments were preferably made with $Co_{75}Fe_5B_{20}$ and $Co_{80}B_{20}$.

It is also possible to use other amorphous metals which are alloys based on transition elements of the iron group. Such an alloy may contain one or more metalloids (B, C, Si, Ge, P) as well as titanium, zirconium, hafnium, and/or niobium. Up to five percent (atom %) of the amorphous metal may consist of other elements.

Figure 3:
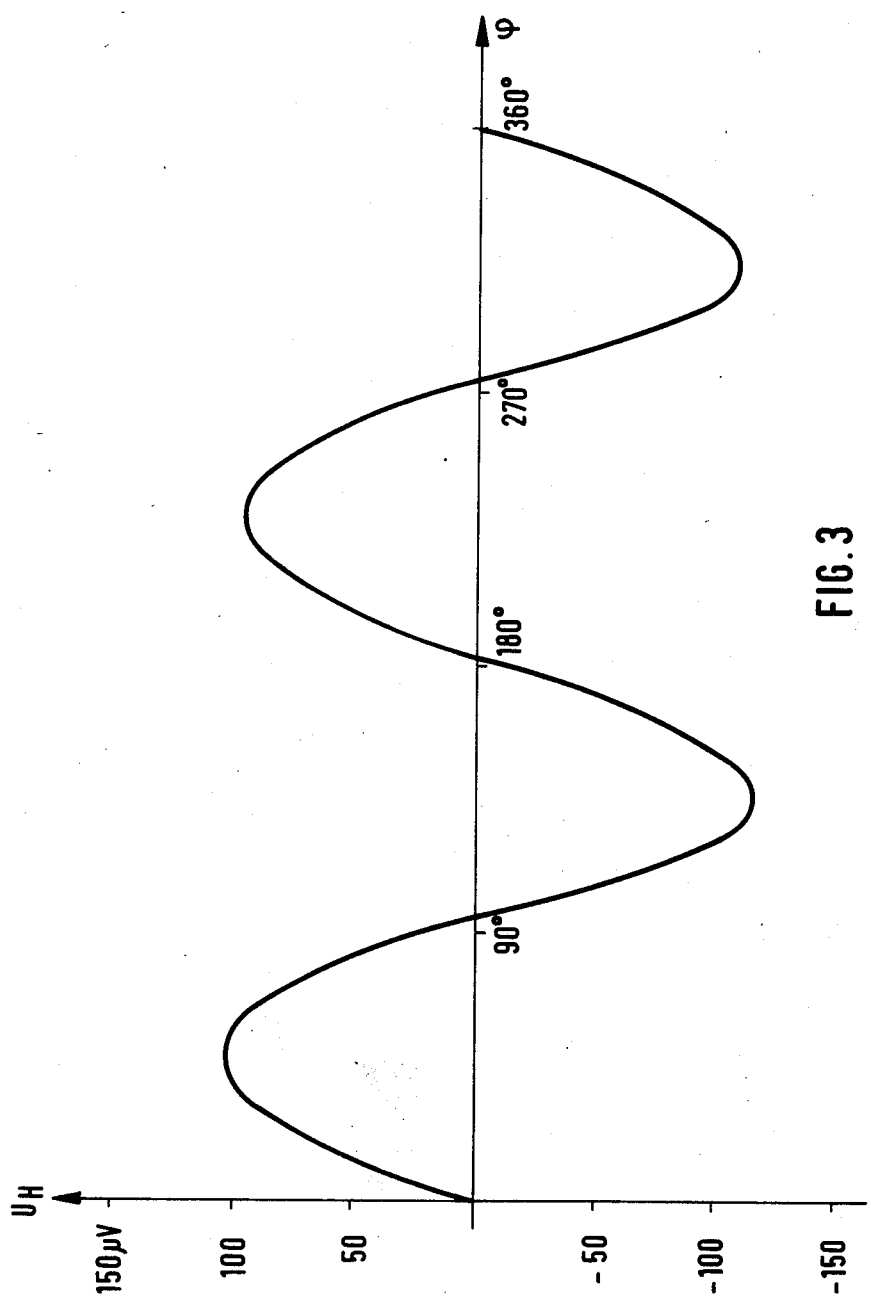
FIG. 3 is a graph of an output voltage of the sensor of FIGS. 1 and 2 versus the direction of an applied magnetic field.

FIG. 3 shows the result of a measurement made on a magnetic field sensor such as sensor 10. The ordinate represents the Hall voltage $U_H$ measured between the electrodes 15 and 16. The absicissa represents the angle between the direction of current flow and the direction of the magnetic field. During the measurement, a direct current of 100 mA was flowing between the electrodes 13 and 14. The magnetic field strength H was 40 Oe. In the example shown, the Hall voltage lies between about $-120$ μV and $+100$ μV.

Both the equation and the curve of FIG. 3 show that the result of the measurement is ambiguous. Unambiguity is obtained only in four angular ranges each including 90°. By using two like magnetic field sensors spaced 45° apart, the direction of a magnetic field can be unambiguously determined, but not the sense of the field. If the sense is to be unambiguously determined, too, two additional magnetic field sensors are necessary. To unambiguously determine the direction, the substrate 11, which is coated with the first active layer 12, is coated with a second active layer of the same kind. The two active layers cover each other. They are isolated from each other, e.g., by being deposited on different sides of the substrate 11. The second active layer has four pad electrodes, too; they are spaced 45° from those of the first active layer.

Figure 4:
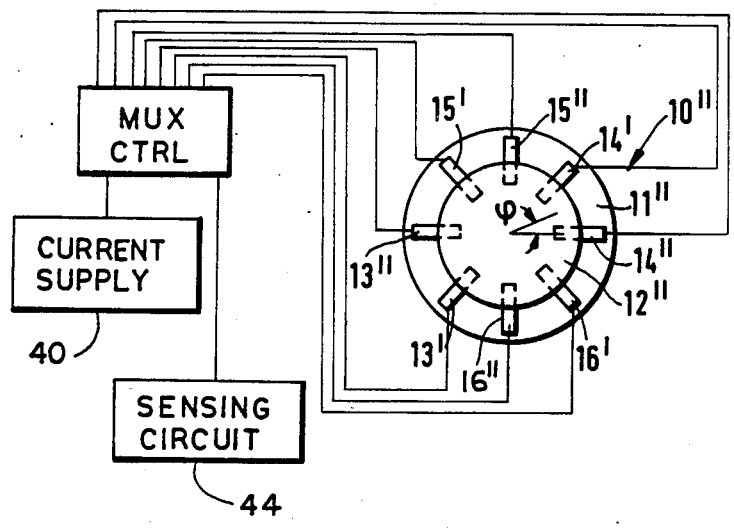
FIG. 4 is a top plan view of another magnetic field sensor constructed in accordance with the invention.

FIG. 4 shows an embodiment of a magnetic field sensor 10" whose active layer 12" is provided with a total of eight pad electrodes 13"–16" and 13' and 16', which are spaced at 45° intervals. Current is supplied (box 40) to the sensor 10" through one of the four opposite electrode pairs 13"/14", 13'/14', 15"/16", or 15'/16' by means of multiplex controller 42. The Hall voltage is taken across the respective perpendicular electrode pair (via multiplex controller 42) and is measured by sensing circuit 44. By making successive measurements, the direction and the sense or polarity of the external magnetic field can thus be determined. The measurements must, of course, follow one another at such short intervals that the direction of the magnetic field does not change in the meantime. In case of a change in the direction of the magnetic field, it depends on the application whether a complete set of measured values is used to determine the direction anew or whether the direction determined last is evaluated as well.

Figure 5:
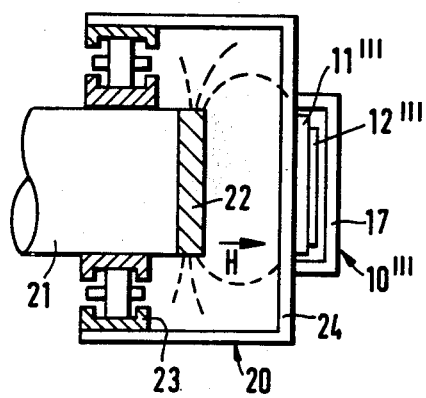
FIG. 5 is a cross-sectional view of a position sensor with a magnetic field sensor constructed in accordance with the invention.

FIG. 5 shows a position sensor 20 with which the angular position of a shaft 21 can be determined. The shaft 21 turns in a ball bearing 23 mounted in an axle box 24. At one end of the shaft 21, a permanent magnet 22 is attached normal to the axis of the shaft. A magnetic field sensor 10''' is attached to the axle box 24. It is located opposite the end of the shaft 21 so that its active layer 12''' is concentric with the shaft 21. Of the magnetic field sensor 10''' the substrate 11''', the active layer 12''', and a case 17 are shown.

Such a position sensor can be used to advantage for determining rotary motions of an arrangement. In the case of an automobile, for example, the rotary motion of a drive wheel can be evaluated to determine the speed of travel and the number of kilometers covered. The engine speed can also be determined in this manner.

Not only the speed of rotation but also the respective angular displacement can be sensed accurately.

The arrangement just mentioned or a corresponding arrangement makes it possible to electrically initiate rotation angle dependent processes in an internal combustion engine. Such processes that can be electrically initiated are the ignition and the opening and closing of electrically operated valves.

What is claimed is:

1. An apparatus for unambiguously determining the direction of the magnetic field using planar Hall effect comprising:
   a single active surface approximately circular in configuration comprised of an electrically conductive ferromagnetic amorphous metal, said ferromagnetic amorphous metal being magnetically isotropic;
   at least eight pad electrodes spaced at 45 degree intervals around the circumference of said single active surface to form pairs of diametrically opposite pad electrodes; and
   means for selectively supplying current to selected ones of said pairs of diametrically opposite pad electrodes and for concurrently measuring Hall voltage across corresponding pairs of diametrically opposite pad electrodes oriented perpendicularly to said selected ones of said pairs of diametrically opposite pad electrodes in successive measurements, said means selectively supplying said current in four sequential directions, each direction angularly offset from a preceding direction by 45 degrees, said means supplying said current in a time interval while said magnetic field is relatively fixed,
   whereby magnetic field strength, direction and sense of said magnetic field are uniquely determined.

2. A magnetic field sensor for use in combination with a current source and sensing circuit, said sensor comprising:
   a substrate;
   a single thin, approximately circular active layer of electrically conductive ferromagnetic material deposited on said substrate;
   eight pad electrodes equally spaced around the circumference of said active layer, each electrode for defining a location of electrical contact with said active layer,
   said electrically conductive ferromagnetic material including a ferromagnetic amorphous metal,
   said electrically conductive ferromagnetic material including magnetically isotropic material
   wherein said circuit comprises:
   means for sequentially providing a current across pairs of diametrically opposite ones of said electrode pads in four sequential directions across said active layer, each direction of said sequence of directions being angularly offset from a preceding direction by 45 degrees; and
   means for sensing, while said current is provided, an output voltage across sequentially selected pairs of said diametrically opposite ones of said eight pad electrodes, said output voltage being sensed across a pair of said pad electrodes connected with one another by a straight line which is orthogonal to a corresponding one of said sequential current directions, said means providing said current and generating said output signals with respect to a relatively fixed magnetic field,
   whereby magnetic field strength, direction and sense are uniquely determined.

3. A magnetic field sensor as claimed in claim 2, wherein:
   said electrically conductive ferromagnetic material includes at least one metalloid from the group comprising (C, Si, Ge).

4. A magnetic field sensor as claimed in claim 3 wherein:
   said electrically conductive ferromagnetic material includes at least one element from the group comprising titanium, zirconium, hafnium and niobium.

5. A magnetic field sensor as claimed in claim 4, wherein:
   up to five percent (atom %) of said electrically conductive ferromagnetic material includes a balance of other elements.

6. A method for unambiguously determining direction of a magnetic field using planar Hall effect comprising the steps of:

supplying current across a first pair of electrodes, said first pair of electrodes electrically coupled to a thin single active layer of conductive ferromagnetic amorphous metal, said ferromagnetic amorphous metal being magnetically isotropic and approximately circular in plan configuration and concurrently sensing the Hall voltage across a second pair of electrodes coupled to said thin single active layer, said second pair of electrodes being perpendicularly oriented with respect to said first pair of electrodes;

supplying current across a third pair of electrodes, said third pair of electrodes electrically coupled to said thin single active layer of conductive ferromagnetic amorphous metal and concurrently sensing the Hall voltage across a fourth pair of electrodes coupled to said thin single active layer, said fourth pair of electrodes being perpendicularly oriented with respect to said third pair of electrodes, said third and fourth pair of electrodes being angularly offset respectively by 45 degrees from said first and second pair of electrodes across which current was supplied and said Hall voltage sensed respectively in said preceding step of supplying current and sensing said Hall voltage, supplying current across said second pair of electrodes and concurrently sensing the Hall voltage across said third pair of electrodes, said steps of supplying and sensing being sequentially performed with respect to said first, second, third and fourth pair of electrodes during a time interval wherein said magnetic field is relatively fixed, whereby the magnetic field strength, direction and sense of said magnetic field is uniquely determined.

* * * * *